United States Patent
Iwamoto

(10) Patent No.: US 6,891,599 B2
(45) Date of Patent: May 10, 2005

(54) STAGE APPARATUS AND EXPOSURE APPARATUS

(75) Inventor: Kazunori Iwamoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 86 days.

(21) Appl. No.: 10/290,529

(22) Filed: Nov. 8, 2002

(65) Prior Publication Data

US 2003/0098961 A1 May 29, 2003

(30) Foreign Application Priority Data

Nov. 28, 2001 (JP) .................................. 2001-362725

(51) Int. Cl.⁷ .................. G03B 27/58; G03B 27/42; G03B 27/32; G03B 27/62
(52) U.S. Cl. ........................ 355/72; 355/53; 355/77; 355/75
(58) Field of Search ........................ 355/53, 72, 75, 355/77; 356/399, 400, 401; 318/625, 632, 687; 250/548; 310/12

(56) References Cited

U.S. PATENT DOCUMENTS

| | | | |
|---|---|---|---|
| 4,854,444 A | 8/1989 | Iwamoto | ..................... 198/750 |
| 5,623,853 A | 4/1997 | Novak et al. | ............ 74/490.09 |
| 5,684,856 A | 11/1997 | Itoh et al. | ..................... 378/34 |
| 5,757,149 A | 5/1998 | Sato et al. | ................... 318/135 |
| 5,767,948 A | 6/1998 | Loopstra et al. | .............. 355/53 |
| 5,781,277 A | 7/1998 | Iwamoto | ..................... 355/53 |
| 5,841,250 A | 11/1998 | Korenage et al. | ........... 318/135 |
| 5,909,272 A | 6/1999 | Osanai et al. | ................. 355/53 |
| 5,933,215 A | 8/1999 | Inoue et al. | ................... 355/53 |
| 6,037,680 A | 3/2000 | Korenaga et al. | ............. 310/12 |
| 6,069,683 A | 5/2000 | Iwamoto | ..................... 355/53 |
| 6,262,794 B1 * | 7/2001 | Miyajima | ..................... 355/53 |
| 6,469,773 B1 | 10/2002 | Iwamoto | ..................... 355/53 |

FOREIGN PATENT DOCUMENTS

| | | |
|---|---|---|
| JP | 9-149672 | 6/1997 |
| JP | 9-167792 | 6/1997 |

* cited by examiner

*Primary Examiner*—Peter B Kim
(74) *Attorney, Agent, or Firm*—Fitzpatrick, Cella, Harper & Scinto

(57) ABSTRACT

A stage apparatus comprising includes a stage that is movable in a direction, a multiphase actuator for generating a driving force when the stage is accelerated and decelerated in the direction, and a single-phase actuator for generating a driving force in the direction when the stage moves at a constant speed.

17 Claims, 8 Drawing Sheets

STAGE APPARATUS AND EXPOSURE APPARATUS

BACKGROUND OF THE INVENTION

1. Field of the Invention

The present invention relates to a stage apparatus suitable for use in high-precision processing, such as semiconductor lithography, and to an exposure apparatus having the stage apparatus.

2. Description of the Related Art

Representative known exposure apparatuses for use in fabrication of semiconductor devices and the like are a step-and-repeat exposure apparatus (also called a stepper) and a step-and-scan exposure apparatus (also called a scanner). In the step-and-repeat exposure apparatus, a pattern on an original plate (reticle or mask) is sequentially transferred onto a plurality of areas on a substrate (wafer of glass substrate) by exposure through a projection optical system while moving the substrate step by step. In the step-and-scan exposure apparatus, step movement and scanning exposure are repeated to expose and transfer a pattern onto a plurality of areas on a substrate. In particular, the step-and-scan exposure apparatus uses only the portion of a projection optical system that is close to the optical axis by limiting an exposure light beam with a slit, and hence can expose fine patterns with high accuracy at a wide field angle.

These exposure apparatuses have stage apparatuses (a wafer stage and a reticle stage) for moving a wafer and a reticle at high speed for positioning. However, the high-speed and high-precision positioning of the stages may be hindered by thrust variations of a multiphase linear motor, disturbances due to vibration caused by switching of a multiphase linear motor coil during the driving of the stages (hereinafter generically named "cogging"), or disturbances transmitted from mounted components such as tubes and cables.

Some suggestions have been made in order to overcome thrust variations of the multiphase linear motor, cogging, and disturbances due to mounted components. For example, Japanese Patent Laid-Open No. 9-149672 discloses an apparatus that improves accuracy by making a table for correcting position errors with respect to desired values based on the result of one scanning operation of a stage. In other known methods, the disturbances of a rough-motion stage that has a long stroke are generally prevented by using a fine-motion stage mounted on a top plate and a multiphase linear motor.

In the control method described in the Japanese Patent Laid-Open application for reducing cogging, however, frequency increases with the stage speed, causing disturbances. Moreover, the amplitude level also increases with stage speed, thereby decreasing stage accuracy. In the other known methods, the fine-motion mechanism that must be constructed on the top plate complicates the structure of the stage and increases the mass of the stage. As a result, control performance is reduced and heat generation increases.

In methods using a fine-motion stage mounted on a top plate, the long-stroke stage is driven by sequentially energizing coils; during scanning exposure, the stage control accuracy is decreased due to torque ripple caused by switching the coils. The stage control accuracy is also decreased by resistance and disturbances due to the cables and tubes connected to the stage during scanning exposure.

SUMMARY OF THE INVENTION

It is an object of the present invention to prevent the stage control accuracy from being decreased during scanning exposure, that is, to increase the stage control accuracy during scanning exposure and to improve imaging performance and overlay accuracy.

In order to achieve the object, according to one aspect, the present invention provides a stage apparatus including a stage that moves in a certain direction, a first actuator that generates a driving force when the stage is accelerated and decelerated in the direction, and a second actuator that generates a driving force in the direction during the movement of the stage.

The stage apparatus includes a multiphase electromagnetic actuator used for control during the acceleration and deceleration of the stage, and a single-phase electromagnetic actuator used for control during the constant-speed movement of the stage. Since coil switching is not performed in the single-phase electromagnetic actuator, torque ripple (cogging) does not occur. Therefore, in an exposure apparatus using the stage apparatus, the control accuracy during scanning exposure of the stage can be increased, and the imaging performance and overlay accuracy can be increased as well.

According to another aspect, the present invention provides a stage apparatus having an electromagnetic actuator serving as a driving means for a stage that moves in a certain direction. In the electromagnetic actuator, a plurality of moving parts that independently move in the direction are provided corresponding to one stator.

For example, the stage includes a plurality of stages tightly fastened to a plurality of corresponding moving parts that are independently movable. In an exposure apparatus, an apparatus base or a base structure and a stage having a reticle or a wafer mounted thereon are connected by hard mounted parts, such as feeder cables, communication cables, and tubes through which fluid such as cooling water flows. In the present stage apparatus, however, in order to prevent a main stage having a reticle or a wafer mounted thereon from being affected by disturbances, the mounted parts are first connected to another stage (substage) and are then connected to the main stage through the substage so that the relative positions of the substage and the main stage will not change. This makes it possible to improve the control accuracy during scanning exposure of the main stage and to increase the imaging performance and overlay accuracy.

According to a further aspect, the present invention provides a scanning exposure apparatus wherein there are provided a plurality of moving parts corresponding to one stator of a multiphase linear motor. A single-phase linear motor is provided between a plurality of moving sections including the moving parts and stages tightly fastened to the moving parts. Mounted parts, such as cables and tubes, connected to a moving section having a reticle are connected to another moving section so that the relative positions of the two moving sections will not change, thus preventing the moving section with the reticle from being affected by disturbances.

The scanning exposure apparatus having such a configuration includes a multiphase electromagnetic actuator used for control during the acceleration and deceleration of the stage, and a single-phase electromagnetic actuator used for control during the constant-speed movement of the stage. Since coil switching is not performed in the single-phase electromagnetic actuator, torque ripple (cogging) does not occur. Moreover, disturbances are not caused by hard mounted parts. Therefore, it is possible to improve the control accuracy during exposure, during which the moving section moves at a constant speed, and to increase the imaging performance and overlay accuracy.

Further objects, features, and advantages of the present invention will become apparent from the following description of the preferred embodiments with reference to the attached drawings.

DESCRIPTION OF THE PREFERRED EMBODIMENTS

Embodiments of the present invention will be described below with reference to the attached drawings.
[First Embodiment]

Figure 1:
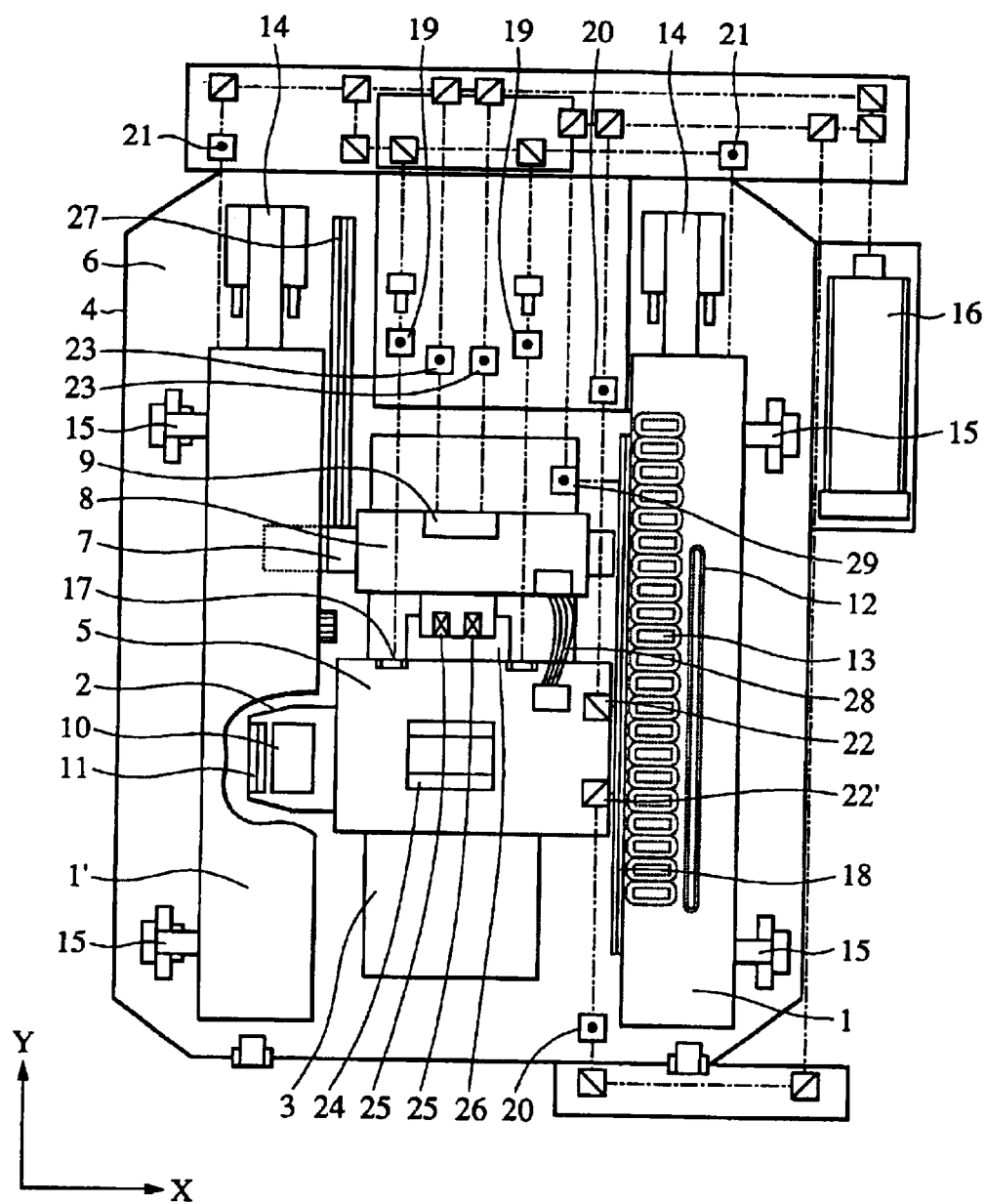
FIG. 1 is an explanatory view showing the configuration of a stage apparatus according to a first embodiment of the present invention.

FIG. 1 shows the configuration of a stage apparatus according to a first embodiment of the present invention. In this stage apparatus, a top plate (main stage) 5 is movable through three degrees of freedom (X-, Y-, and θ-directions), and, for example, is used as a reticle-scanning stage in the above-described scanning exposure apparatus (scanner).

Referring to FIG. 1, a flat guide surface 6 is formed as a reference surface on a base structure 4, and a stage guide 3 is fastened thereto. The top plate 5 is supported by hydrostatic bearings so that it is not in contact with the stage guide 3, and so that it is movable in the X-, Y-, and θ-directions. On both sides of the top plate 5, an electromagnetic actuator for driving the top plate 5 in the Y-direction with a long stroke, and an electromagnetic actuator for driving the top plate 5 in the X-direction with a short stroke are provided. The electromagnetic actuators have moving parts 2 and right and left separate stators 1 and 1', respectively. The right and left moving parts 2 are tightly fastened to the top plate 5. The right and left stators 1 and 1' are supported by hydrostatic bearings so that they are not in contact with the flat guide surface 6, and so that they are movable in the X-, Y-, and θ-directions (in the planar direction).

The stators 1 and 1' have a predetermined weight and function as reactive-force counters which will be described later. Each of the right and left moving parts 2 is provided with a moving-part Y-magnet 10 and a moving-part X-magnet 11. In each of the right and left stators 1 and 1', an X-axis linear motor single-phase coil 12, and a Y-axis linear motor multiphase coil 13 having a plurality of coils arranged in the Y-direction, are placed. The top plate 5 is moved in the X- and Y-directions by controlling the current to be applied to these coils.

The position of the top plate 5 is measured with a laser interferometric length-measuring system that is constituted by a laser head 16, a Y-axis measuring mirror 17, an X-axis measuring bar mirror 18, two right and left Y-axis measuring interferometers 19, two front and rear X-axis measuring interferometers 20, and the like. That is, the Y-axis positions of the stators 1 and 1' are measured with two right and left Y-axis stator measuring interferometers 21, and the X-axis position of the top plate 5 is measured with the X-axis measuring interferometers 20 by applying laser light from the Y-direction for measurement onto optical elements 22 and 22' mounted on the top plate 5, and reflecting or polarizing the measurement laser light in the X-axis direction so that the light enters the X-axis measuring bar mirror 18.

A secondary top plate (substage) 8 is supported by hydrostatic bearings so that it is not in contact with the stage guide 3 and so that it is movable in the X-, Y-, and θ-directions, in a manner similar to that of the top plate 5. On both sides of the secondary top plate 8, an electromagnetic actuator for driving the secondary top plate 8 in the Y-direction with a long stroke and an electromagnetic actuator for driving the secondary top plate 8 in the X-direction with a short stroke are provided. Moving parts 7 of the electromagnetic actuators are tightly fastened to both sides of the secondary top plate 8. Each of the right and left moving parts 7 is provided with a moving-part Y magnet and a moving-part X magnet. The above-described stators 1 and 1' for driving the top plate 5 are also used for the secondary top plate 8.

The position of the secondary top plate 8 is measured with a laser interferometric measuring system that is constituted by a secondary-top-plate measuring mirror 9, two right and left Y-axis measuring interferometers 23, an X-axis measuring interferometer 29, and the like.

An electromagnetic actuator that can generate a driving force in a non-contact state is interposed between the top plate 5 and the secondary top plate 8. Two right and left coils 25 in the electromagnetic actuator are attached to the secondary top plate 8, and a magnet 26 is attached to the top plate 5. Mounted parts 28, such as feeder cables, communication cables, and tubes through which fluid flows extend between the top plate 5 and the secondary top plate 8.

Mounted parts 27, such as flat cables and flat tubes, extend between the moving parts 7 and the base structure 4, and move along the flat guide surface 6 which serves as the reference surface in relation to the movement of the moving parts 7.

The stage apparatus of the first embodiment may be used as a reticle stage and/or a wafer stage in an exposure apparatus. An original plate (reticle) 24 or a substrate (wafer) is mounted on the top plate 5 (X-Y stage) in the moving section.

The moving section in which the original plate (reticle) 24 or the substrate (wafer) is mounted on the top plate (X-Y stage) 5 is moved in the X-, Y-, and θ-directions by the electromagnetic actuators that are constituted by the moving parts 2 and the right and left stators 1 and 1'. The stators 1 and 1' receive a driving reactive force that counters a force acting during the movement of the entire moving section, and are moved on the flat guide surface 6 by the driving reactive force. By moving on the flat guide surface 6, the stators 1 and 1' function as reactive-force counters. For example, when the entire moving section moves in the +Y-direction, the stators 1 and 1' receive the driving reactive force in the −Y direction, and thereby move in the −Y direction.

In the first embodiment, the stators 1 and 1' serving as the reactive-force counters receive the reactive force produced when the moving section, including the top plate 5 and the secondary top plate 8 of the stage apparatus, is accelerated or decelerated. The reactive force is converted into kinetic energy by the movement of the stators 1 and 1' (reactive-force counters). Since the acting force and its reactive force are limited within the flat guide surface 6 of the base structure 4, it is possible to prevent the reactive force of the stage apparatus from exciting the base structure 4 and from disturbing the floor on which the apparatus is installed. Consequently, the stage apparatus and other apparatuses will not vibrate. Furthermore, since the separate stators 1 and 1' (reactive-force counters) move on the base structure 4 in accordance with the acceleration of the moving section, an offset load can be reduced when the moving section moves. In a case in which the stage apparatus is applied to an exposure apparatus, the overlay accuracy of the exposure apparatus can be increased. That is, in the first embodiment, since the stators 1 and 1' move in the direction opposite to the moving direction of the moving section, it is possible both to prevent the center of gravity of the entire apparatus, including the moving section and the stators, from varying, and to reduce the offset load when the moving section moves.

The base structure 4 is provided with two right and left Y-axis position controlling linear motors 14 for pushing back the right and left stators 1 and 1' that have excessively moved in the Y-axis direction, and four right, left, front, and rear X-axis position controlling linear motors 15 for pushing back the stators 1 and 1' that have excessively moved in the X-axis direction. Although the stators 1 and 1' excessively move when the moving section excessively moves, they can be controlled by the Y-axis position controlling linear motors 14 and the X-axis position controlling linear motors 15 that move the stators to predetermined positions. Even when the stators 1 and 1' are displaced because of resistance, friction, or the like, the positions thereof can be corrected by using the Y-axis position controlling linear motors 14 and the X-axis position controlling linear motors 15 instead of using the electromagnetic actuators.

A description will be given of a scanning operation of the top plate 5 in a case in which the stage apparatus of the present invention is adopted in a scanning exposure apparatus. The top plate 5 is accelerated to a predetermined speed by an electromagnetic force acting between the right and left moving parts 2 and stators 1 and 1'. In a constant speed region, the current applied to the multiphase coil 13 is controlled such that a Y-direction electromagnetic force does not act on the moving parts 2 of the top plate 5. The position in the θ-direction of the top plate 5 is adjusted by controlling the electromagnetic force between the two single-phase coils 25 and the magnet 26.

The position in the X-direction of the top plate 5 is adjusted by the long single-phase coils 12. The secondary top plate 8 is controlled by the electromagnetic force acting between the right and left moving parts 7 and the stators 1 and 1' during both the constant-speed time and the acceleration or deceleration time. Since the positions of the top plate 5 and the secondary top plate 8 are measured with the interferometers, they can be controlled independently. While the top plate 5 is precisely positioned so as to insure high exposure accuracy, it is satisfactory that the secondary top plate 8 is positioned to such an accuracy as will avoid mechanical interference with the top plate 5.

In the first embodiment, in a region in which the top plate 5 is moved at a constant speed, an electromagnetic force is not produced between the multiphase coils 13 and the moving parts 2, the secondary top plate 8 is driven by the multiphase coils 13 and the moving parts 7, and the position of the top plate 5 is controlled relative to the secondary top plate 8 by using the electromagnetic force between the single-phase coils 25 and the magnet 26. Since the driving in the X-, Y-, and θ-directions is performed by the single-phase linear motors during the scanning exposure operation and in the constant-speed traveling region of the top plate 5, cogging due to switching among the coils of the multiphase linear motor is not caused. Since the top plate 5 is driven by the non-contact single-phase linear motors, the transmission to the top plate 5 of vibration, which is caused by cogging of the secondary top plate 8, is minimized.

The secondary top plate 8 is provided with the mounted parts 27 that move in a long stroke, and the top plate 5 is provided with the mounted parts 28 that move in a short stroke. Disturbances are caused by the mounted parts 27 that move in a long stroke, and vibration is transmitted to the secondary top plate 8. Since the distance between the top plate 5 and the secondary top plate 8 varies only within the range of several tens of micrometers, the mounted parts 28 do not cause disturbances that affect the accuracy of the top plate 5. That is, disturbances caused by the mounted parts 27 are not transmitted to the top plate 5 as vibration that affects the accuracy.

Since cogging is not transmitted to the top plate 5 during exposure, the overlay accuracy and the linewidth accuracy can be increased. Although cogging is promoted by increasing the speed of the stage, the accuracy is not decreased, due to the configuration of the top plate 5 and the secondary top plate 8, and therefore, the throughput can be enhanced.

The stage apparatus of the present invention is suitably used in a so-called step-and-scan exposure apparatus (scanner) in which a reticle pattern is sequentially transferred onto a plurality of shot areas of a wafer by synchronously scanning a reticle and the wafer and moving the wafer step by step during exposure. The present invention is applicable not only to the step-and-scan exposure apparatus, but also to a step-and-repeat exposure apparatus (stepper) in which a wafer stage moves step by step at a high speed.

[Second Embodiment]

Figure 2:
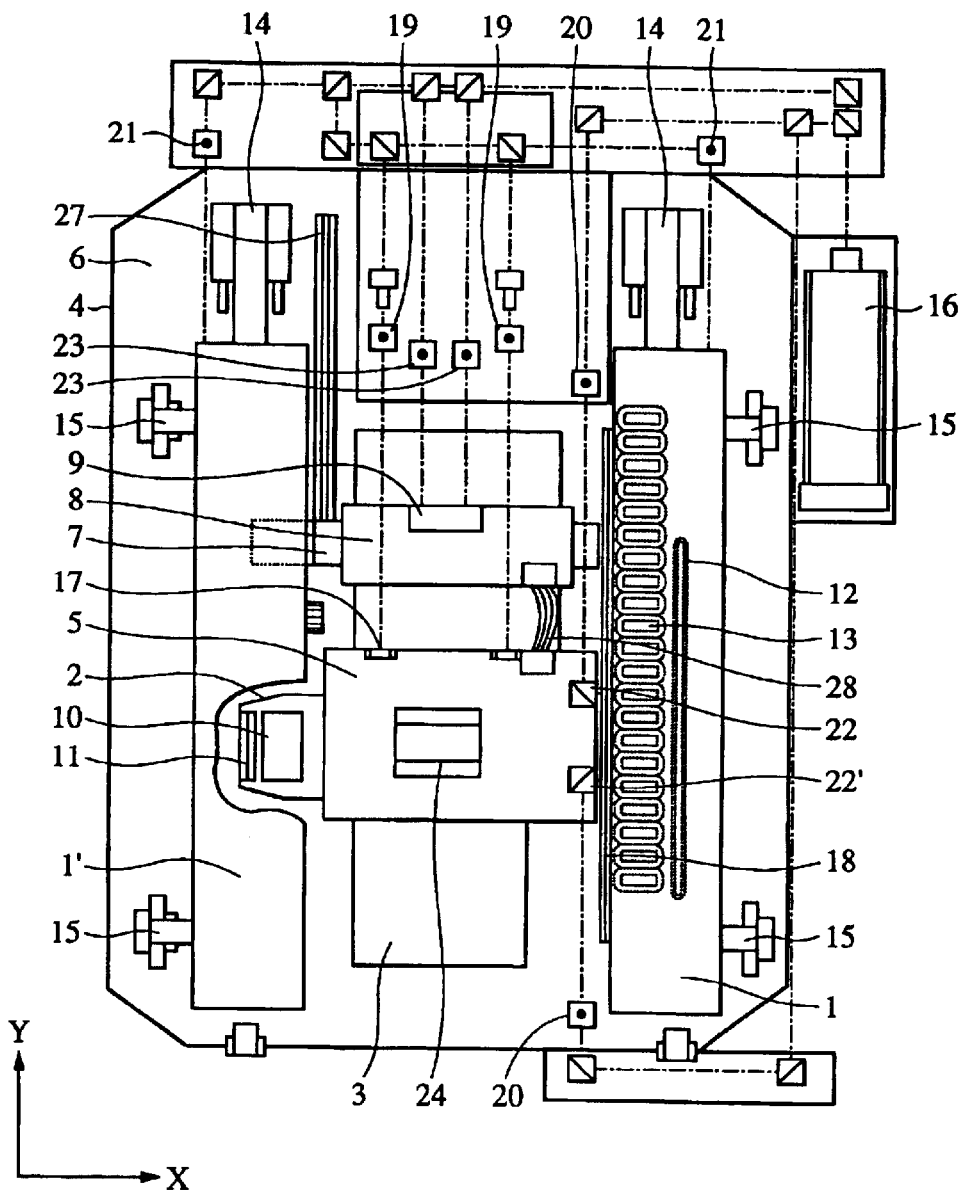
FIG. 2 is an explanatory view showing the configuration of a stage apparatus according to a second embodiment of the present invention.

FIG. 2 shows the configuration of a stage apparatus according to a second embodiment of the present invention. The stage apparatus shown in FIG. 2 is different from the stage apparatus shown in FIG. 1 in that the linear motor coils 25 and the magnet 26 are not provided between a top plate 5 and a secondary top plate 8. The stage apparatus of the second embodiment also does not have the laser interferometer 29 for measuring the position in the X-direction of the secondary top plate 8.

In the second embodiment, cogging is not transmitted from mounted parts 27 to the top plate 5 for a reason similar to that in the first embodiment. Although, unlike in the first embodiment, cogging occurs because moving parts 2 and stators 1 and 1' are also used during the constant-speed movement of the top plate 5, since a linear motor is not provided between the top plate 5 and the secondary top plate 8, the weight of the moving section can be reduced, and heat generation by multiphase linear motor coils 13 can be reduced.

Furthermore, the accuracy of the top plate 5 can be enhanced by replacing the mounted parts 28 between the top plate 5 and the secondary top plate 8 with communication means, such as infrared rays, in order to reduce the number of the mounted parts 28.

In a case in which the second embodiment is applied to an exposure apparatus, cogging is not transmitted from the mounted parts to the top plate 5 during exposure, and heat generation by the multiphase linear motor coils 13 can be reduced. Thus, it is possible to achieve a high-speed acceleration, and to improve the overlay accuracy, the linewidth accuracy, and the throughput.

[Third Embodiment]

Figure 3:
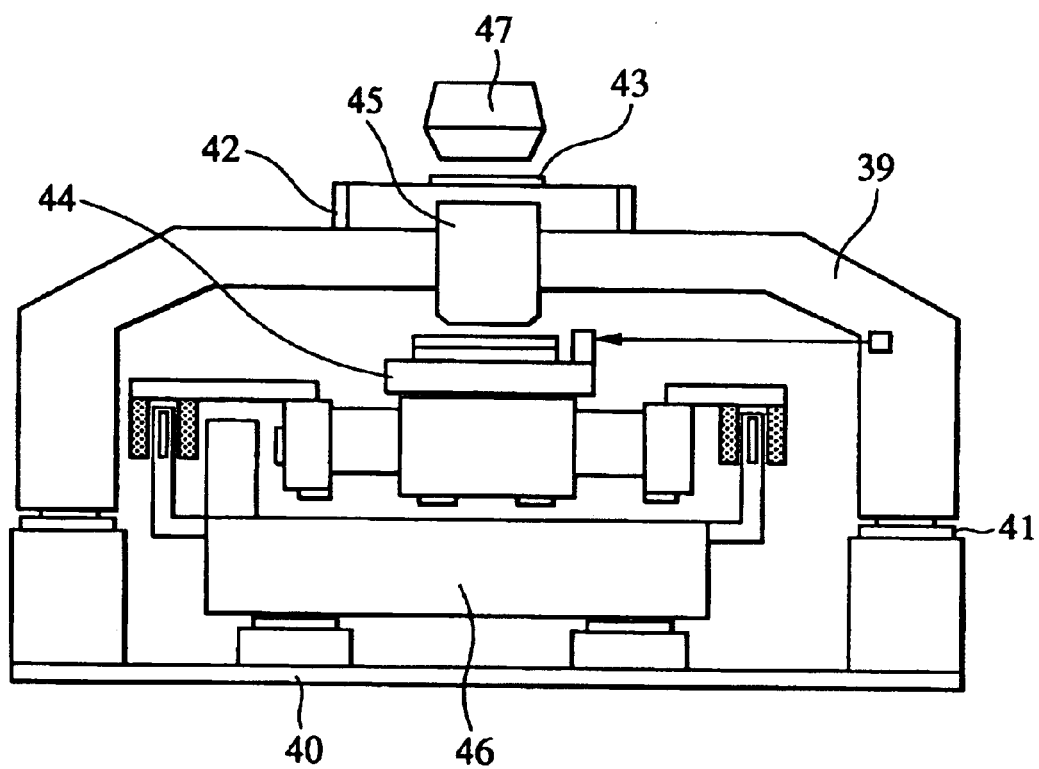
FIG. 3 is an explanatory view of an exposure apparatus that adopts the stage apparatus of the present invention.

A description will now be given of a scanning exposure apparatus, in which the stage apparatus of the second embodiment is mounted as a wafer stage, with reference to FIG. 3.

A barrel surface plate 39 is supported on the floor or a base 40 with a damper 41 therebetween. The barrel surface plate 39 supports a reticle-stage surface plate 42, and also supports a projection optical system 45 interposed between a reticle stage 43 and a wafer stage 44. The wafer stage 44 is disposed on a stage surface plate 46 that is supported on the floor or the base 40 so as to position a wafer mounted thereon. The reticle stage 43 is supported on the reticle-stage surface plate 42 supported by the barrel surface plate 39 so as to move a reticle having a circuit pattern mounted thereon. An illumination optical system 47 emits exposure light for exposing a reticle mounted on the reticle stage 43 and transferring the circuit pattern thereof onto a wafer placed on the wafer stage 44.

The wafer stage 44 is scanned in synchronization with the reticle stage 43. While the reticle stage 43 and the wafer stage 44 are being scanned, the positions thereof are continuously detected by corresponding interferometers, and the positions are fed back to driving sections for the reticle stage 43 and the wafer stage 44. Consequently, the scanning start positions of the reticle stage 43 and the wafer stage 44 can be precisely synchronized, and the scanning speed in the constant-speed region can be precisely controlled. While the reticle stage 43 and the wafer stage 44 are scanned relative to the projection optical system 45, the circuit pattern of the reticle is transferred onto the wafer by exposure.

Since the stage of the second embodiment is used as the reticle stage 43 and the wafer stage 44 in the third embodiment, the position and attitude of the stages in the third embodiment during exposure can be precisely controlled, and a high-speed and high-precision exposure can be achieved.

EXAMPLES OF SEMICONDUCTOR FABRICATION SYSTEM

A description will now be given of an example of a fabrication system for semiconductor devices (for example, semiconductor chips such as ICs and LSIs, liquid crystal panels, CCDS, thin-film magnetic heads, and micromachines). The fabrication system offers maintenance service, such as troubleshooting, regular maintenance, or software delivery, to a fabrication apparatus installed in a semiconductor fabrication facility across a computer network outside the fabrication facility.

Figure 4:
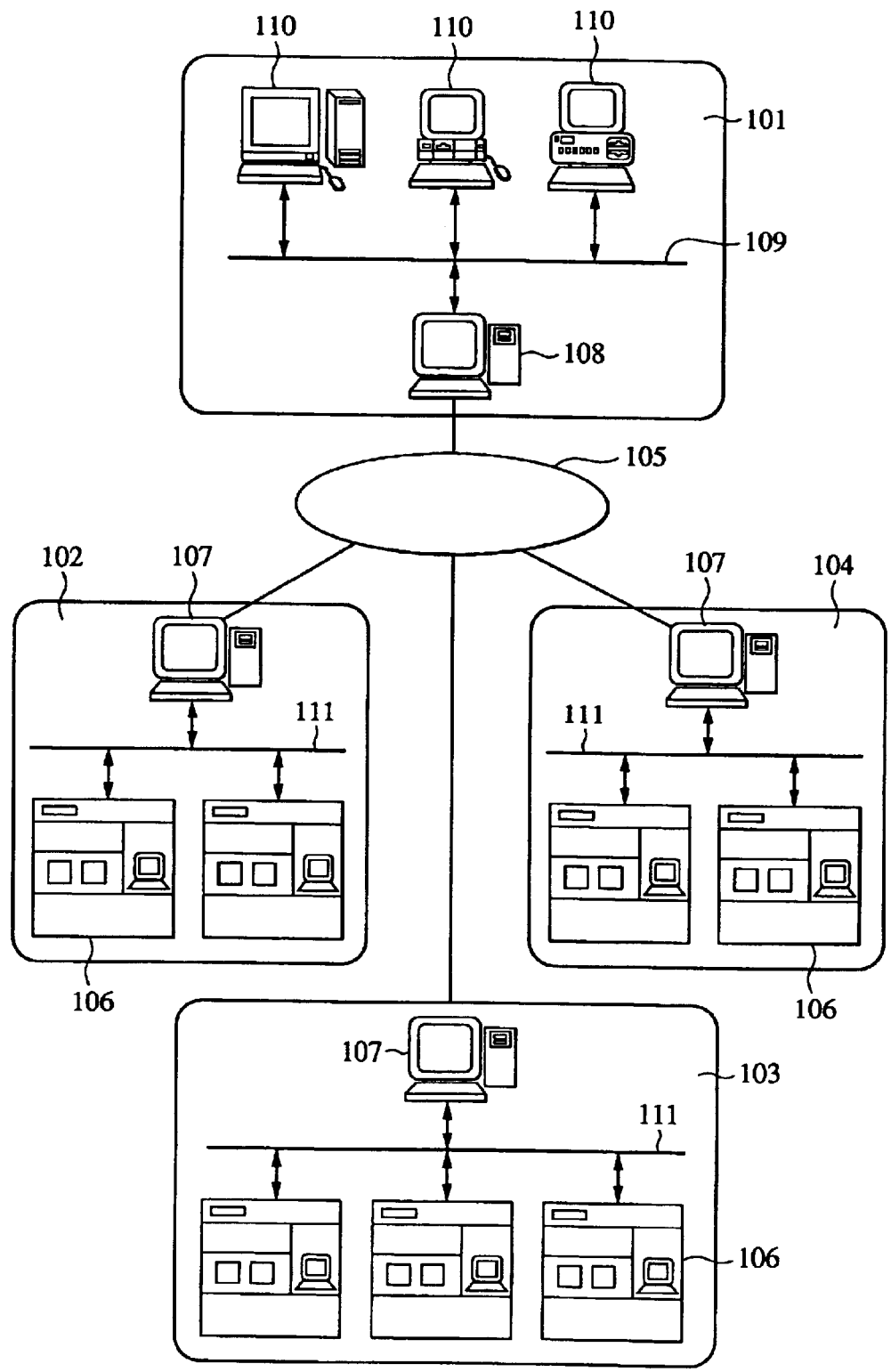
FIG. 4 is a conceptual view showing an example of a fabrication system for semiconductor devices.

FIG. 4 shows the entire fabrication system. In FIG. 4, reference numeral 101 denotes an office of a vendor (apparatus manufacturer) that provides semiconductor-device fabrication apparatuses. The fabrication apparatuses include semiconductor fabrication apparatuses for performing various processes used in semiconductor fabrication facilities, for example, front-end process apparatuses (for example, a lithographic apparatus such as an exposure apparatus, a resist coating apparatus, or an etching apparatus; a heat treatment apparatus; a film deposition apparatus; and a planarizing apparatus) and back-end process apparatuses (for example, an assembly apparatus and an inspection apparatus). The office 101 is furnished with a host management system 108 for providing a maintenance database for the fabrication apparatuses, a plurality of operation terminal computers 110, and a local area network (LAN) 109 for linking the operation terminal computers 110 so as to construct an intranet. The host management system 108 is provided with a gateway for connecting the LAN 109 to the Internet 105 serving as an external network outside the office 101, and has a security function for restricting external access.

In FIG. 4, reference numerals 102 and 104 denote fabrication facilities of a semiconductor manufacturer serving as a user of the fabrication apparatuses. The fabrication facilities 102 to 104 may belong to different manufacturers, or they may belong to the same manufacturer (for example, they may include a fabrication facility for front end processes and a fabrication facility for back end processes). Each of the fabrication facilities 102 to 104 is furnished with a plurality of fabrication apparatuses 106, a LAN 111 for linking the fabrication apparatuses 106 together to construct an intranet, and a host management system 107 serving as a monitor that monitors the operational statuses of the fabrication apparatuses 106. The host management system 107 provided in each of the fabrication facilities 102 to 104 has a gateway for connecting the LAN 111 to the Internet 105 serving as the external network. Accordingly, only the users who are permitted by the security function of the host management system 108 of the vendor 101 are allowed to have access from the LAN 111 in each fabrication facility to the host management system 108 through the Internet 105. More specifically, it is possible to send status information representing the operational status of each fabrication apparatus 106 (for example, information about problems occurring in the fabrication apparatus) from the fabrication facility to the vendor 101 through the Internet 105, and to receive response information corresponding to the sent information (for example, information indicating a remedy for the trouble, and software and data for the remedy), and maintenance information, such as the latest software and help information, from the vendor 101 through the Internet 105. Data communication between each of the fabrication facilities 102 to 104 and the vendor 101 and data communication across the LAN 111 in the fabrication facility are carried out using the communication protocol (TCP/IP) that is generally used on the Internet. Instead of the Internet, a high-security dedicated network that does not allow access to third parties (for example, ISDN) may be used as the external network. Instead of the vendor providing the host management system, the user may construct and install a database on the external network so that a plurality of fabrication facilities of the user will have access to the database.

Figure 5:
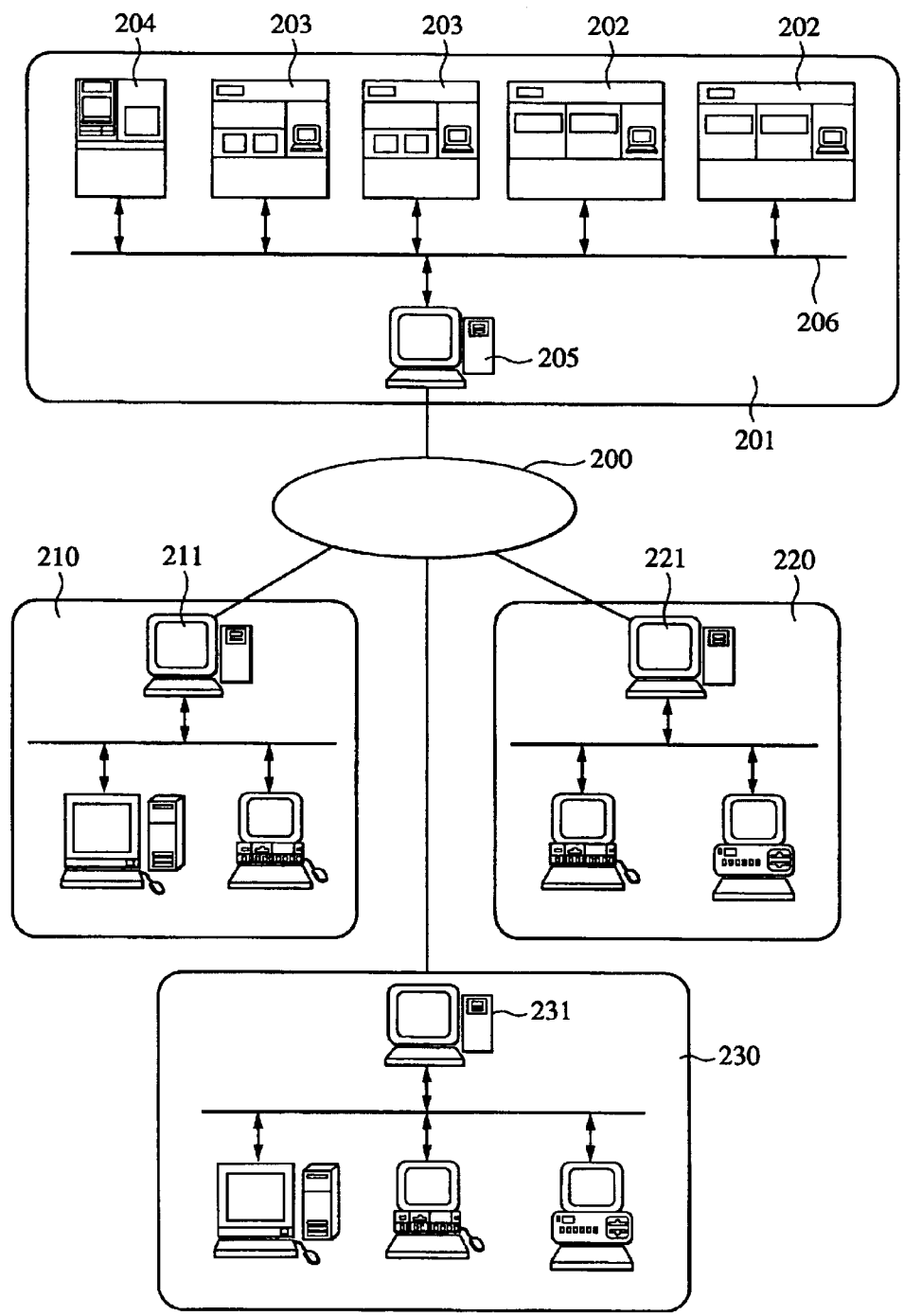
FIG. 5 is a conceptual view showing another example of a fabrication system for semiconductor devices.

FIG. 5 is a conceptual view showing another example of the fabrication system. In the example of FIG. 4, a plurality of user fabrication facilities each furnished with the fabrication apparatuses are connected to the management system of the vendor of the fabrication apparatuses by the external network, and information about fabrication management in each fabrication facility and information about at least one of the fabrication apparatuses are exchanged across the external network. In contrast, in the example of FIG. 5, a fabrication facility furnished with fabrication apparatuses from a plurality of vendors is connected to a management system of each vendor by an external network outside the fabrication facility so that maintenance information about the fabrication apparatuses is exchanged by data communication. Fabrication apparatuses for performing various processes, exposure apparatuses 202, resist coating apparatuses 203, and a film deposition apparatus 204, in this example, are installed in a fabrication line of a fabrication facility 201, which serves as a user of the fabrication apparatuses (semiconductor-device manufacturer). While only one fabrication facility 201 is shown in FIG. 5, in actuality, a plurality of fabrication facilities are similarly networked. In each fabrication facility, the apparatuses are connected across a LAN 206 to construct an intranet, and the operation of the fabrication line is controlled by a host management system 205. In contrast, offices of vendors (apparatus manufacturers), such as an exposure-apparatus manufacturer 210, a resist-coating-apparatus manufacturer 220, and a film-deposition-apparatus manufacturer 230, are furnished with host management systems 211, 221 and 231, respectively, and the host management systems 211, 221, and 231 each include a maintenance database and a gateway for the external network, as described above. The host management system 205 for managing the apparatuses in the fabrication facility serving as the user is connected to the management systems 211, 221, and 231 of the vendors of the apparatuses by the Internet, serving as an external network 200, or by a dedicated network. In this system, when trouble occurs in any of the fabrication apparatuses in the fabrication line, the operation of the fabrication line is stopped. However, a prompt response can be given because of remote maintenance by the vendor of the apparatus through the Internet 200, and the idle period of the fabrication line can be minimized.

Figure 6:
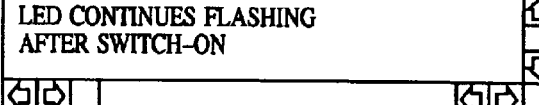
FIG. 6 is a view showing a specific example of a user interface.

Each of the fabrication apparatuses installed in the semiconductor fabrication facility includes a display, a network interface, and a computer for executing software for network access and software for operating the apparatus, which are stored in a storage device. The storage device is, for example, an internal memory, a hard disk, or a network file server. The network access software includes a dedicated or general-purpose web browser, and provides, for example, a user interface shown in FIG. 6 on the display. An operator that manages the fabrication apparatuses in each fabrication facility inputs information, such as the type of the fabrication apparatus (401), the serial number (402), the subject (403), the date (404), the urgency (405), the problem (406), the remedy (407), and the progress (408), while viewing the entry screen. The input information is sent to the maintenance database through the Internet, and proper maintenance information corresponding thereto is sent back from the maintenance database and is indicated on the display. The user interface provided by the web browser has hyperlinks 410 to 412, as shown in FIG. 6, so that the operator can access more detailed information about each item, receive the latest software for the fabrication apparatus from a software library provided by the vendor, and receive an operation guide (help information) for reference.

Figure 7:
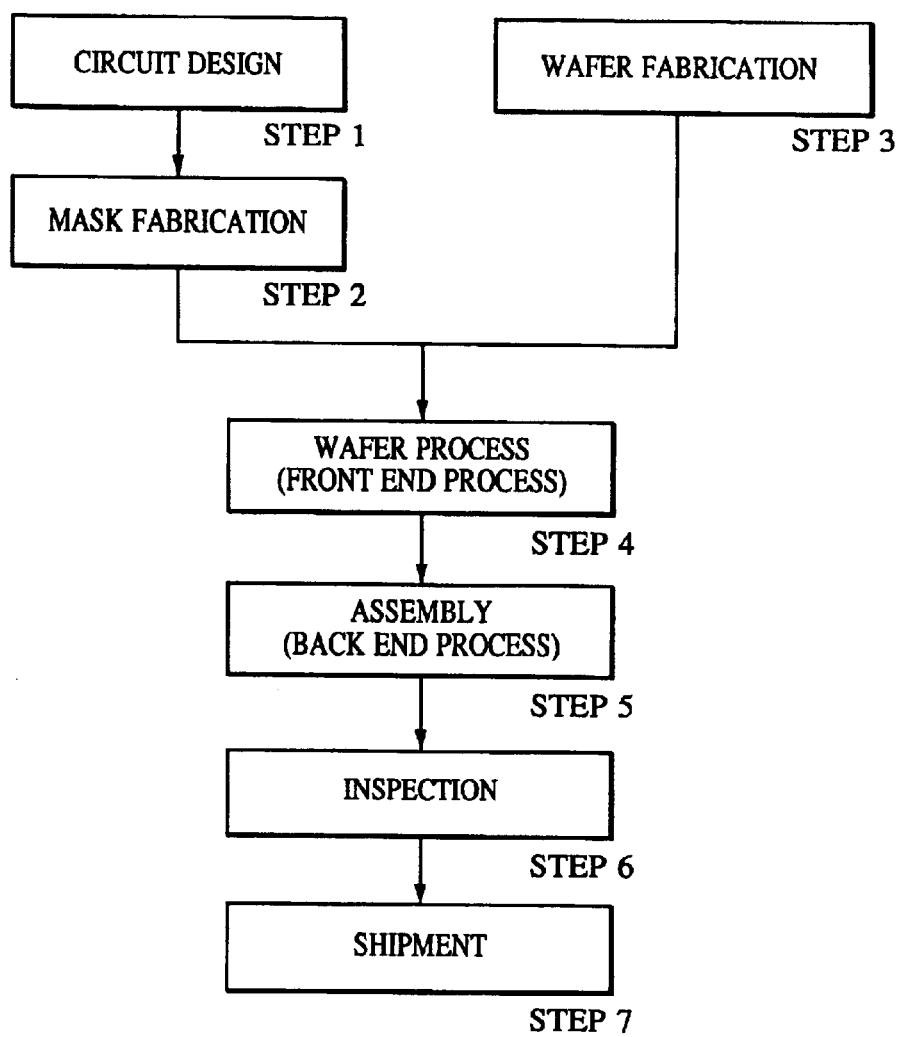
FIG. 7 is a flowchart showing a device fabrication procedure.

A description will now be given of a semiconductor-device fabrication procedure using the fabrication system. FIG. 7 shows the flow of the whole semiconductor-device fabrication procedure. In Step 1 (circuit design), a circuit pattern of a semiconductor device is designed. In Step 2 (mask fabrication), a mask having the designed circuit pattern is fabricated. On the other hand, in Step 3 (wafer fabrication), a wafer is made of silicon or the like. In Step 4 (wafer process), called a front end process, an actual circuit is formed on the wafer by lithography using the prepared mask and wafer. In Step 5 (assembly), called a back end process, a semiconductor chip is produced using the wafer fabricated in Step 4. The back end process includes an assembly step (dicing and bonding), a packaging step (chip encapsulation), and the like. In Step 6 (inspection), the semiconductor device produced in Step 5 is subjected to inspections such as an operation confirmation test and a durability test. The complete semiconductor device is shipped in Step 7. The front end process and the back end process are performed by corresponding fabrication facilities, and maintenance is performed in each of the fabrication facilities by the remote maintenance system. Information about fabrication management and apparatus maintenance is exchanged by data communication between the front-end-process facility and the back-end-process facility across the Internet or a dedicated network.

Figure 8:
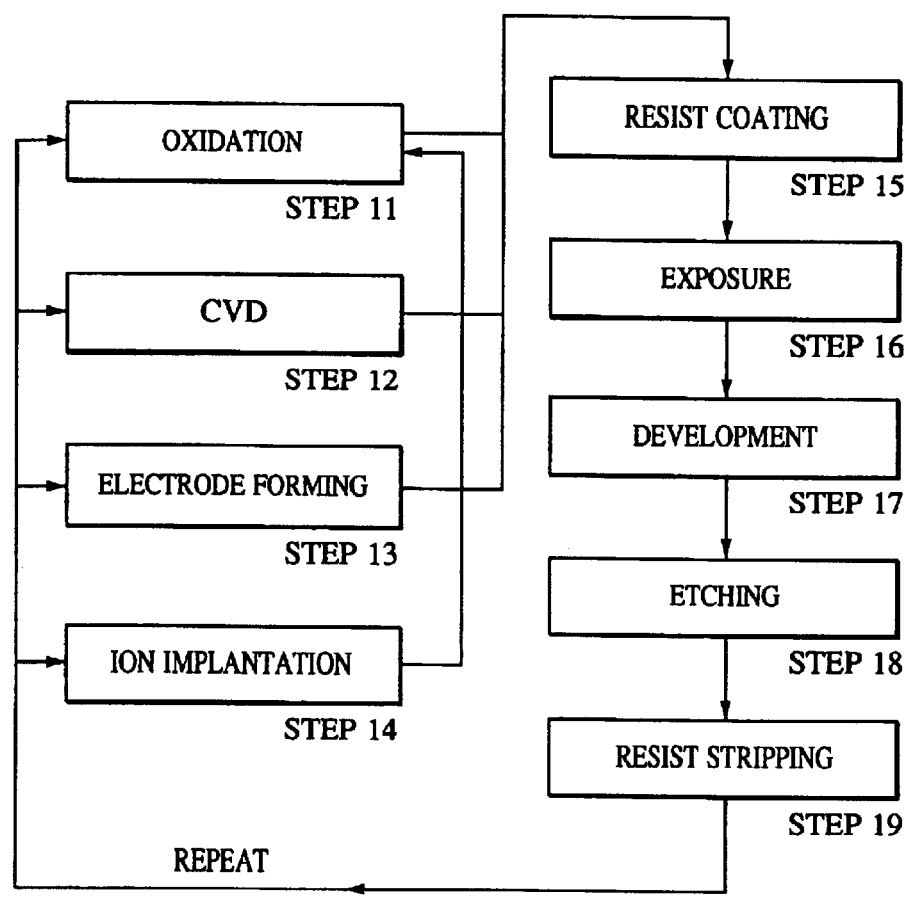
FIG. 8 is a flowchart showing a wafer process.

FIG. 8 shows a detailed flow of the wafer process of FIG. 7. In Step 11 (oxidation), the surface of the wafer is oxidized. In Step 12 (CVD), an insulating film is formed on the wafer surface. In Step 13 (electrode formation), electrodes are formed on the wafer by vapor deposition. In Step 14 (ion implantation), ions are implanted into the wafer. In Step 15 (resist coating), a sensitive material is applied on the wafer. In Step 16 (exposure), the circuit pattern of the mask is transferred onto the wafer by exposure with the exposure apparatus. In Step 17 (development), the exposed wafer is developed. In Step 18 (etching), a portion other than the developed resist image is removed. In Step 19 (resist stripping), the resist, which has become unnecessary after etching, is removed. By repeating Steps 11 to 19, multiple circuit patterns are formed on the wafer. Since the fabrication apparatuses used in Steps 11 to 19 are maintained by the remote maintenance system described above, trouble can be avoided. Even when trouble occurs, a prompt recovery is possible, and the productivity of the semiconductor device can be made higher than before.

In a case in which the stage apparatus of the present invention is applied to an exposure apparatus, cogging affecting the stage on which the reticle or the wafer is mounted during exposure, for example, cogging due to switching of a multiphase linear motor, and disturbances due to mounted parts, can be minimized. Consequently, the overlay accuracy, the linewidth accuracy, and the like can be made higher than before, and the throughput can be enhanced.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A stage apparatus comprising:

a main stage that is movable in a direction;

a substage that is movable independently of said main stage;

a multiphase actuator for generating a driving force when said main stage is accelerated and decelerated in the direction; and a single-phase actuator provided on at least one of said main stage and said substage for generating a driving force for driving said main stage relative to said substage in the direction when said main stage moves at a constant speed.

2. A stage apparatus comprising:

a main stage that is movable in a direction;

a substage that is movable independently of said main stage;

a multiphase actuator for generating a driving force when said main stage is accelerated and decelerated in the direction, wherein said multiphase actuator includes a multiphase linear motor in which a plurality of moving parts for independently moving said main stage and said substage are provided corresponding to one stator; and a single-phase actuator for generating a driving force for driving said main stage relative to said substage in the direction when said main stage moves at a constant speed.

3. A stage apparatus comprising:

a plurality of stages that are independently movable in a direction; and an electromagnetic actuator that serves to move said plurality of stages, wherein said electromagnetic actuator includes a plurality of moving parts that are tightly fastened to said stages and are provided corresponding to one stator, wherein at least one of said plurality of stages is connected by hard mounted parts.

4. An apparatus according to claim 3, further comprising means for measuring the positions of said stages.

5. An apparatus according to claim 3, further comprising a guide surface having a degree of freedom in the direction so as to guide said plurality of stages.

6. An apparatus according to claim 5, wherein said guide surface is formed on one of (i) said stator of said electromagnetic actuator and (ii) a member mechanically fastened to said stator.

7. An apparatus according to claim 5, wherein said plurality of stages have a common guide.

8. An exposure apparatus comprising:

exposure means for exposing and projecting a part of a pattern on an original plate onto a substrate through a projection optical system;

a main stage that is movable in a direction;

a substage that is movable independently from said main stage;

a multiphase actuator for generating a driving force when said main stage is accelerated and decelerated in the direction; and a single-phase actuator provided on at least one of said main stage and said substage for generating a driving force for driving said main stage relative to said substage in the direction when said main stage moves at a constant speed.

9. An apparatus according to claim 8, further comprising:

a display;

a network interface; and a computer for executing network software, wherein maintenance information about said exposure apparatus is exchanged by data communication through a computer network.

10. An apparatus according to claim 9, wherein the network software is connected to an external network outside a facility in which said exposure apparatus is installed, and provides to a vendor or a user of said exposure apparatus a user interface on said display so that information can be obtained from a database across said external network.

11. A semiconductor-device fabrication method comprising the steps of:

installing fabrication apparatuses for performing various processes, including an exposure apparatus, in a semiconductor fabrication facility; and fabricating a semiconductor device through a plurality of processes with said fabrication apparatuses, wherein the exposure apparatus has exposure means for exposing and projecting a part of a pattern on an original plate onto a substrate through a projection optical system, a main stage that is movable in a direction so as to move at least one of the original plate and the substrate for exposure, a substage that is movable independently of the main stage, a multiphase actuator for generating a driving force when the main stage is accelerated and decelerated in the direction, and a single-phase actuator provided on at least one of the main stage and the substage for generating a driving force for driving the main stage relative to the substage in the direction when the main stage moves at a constant speed.

12. A method according to claim 11, further comprising the steps of:

linking the fabrication apparatuses across a local area network; and exchanging information about at least one of the fabrication apparatuses by data communication between said local area network and an external network outside said semiconductor fabrication facility.

13. A method according to claim 12, further comprising performing one of (i) obtaining maintenance information about the fabrication apparatus by data communication by accessing a database provided by a vendor or a user of the exposure apparatus across the external network, and (ii) fabrication management using data communication with another semiconductor fabrication facility across the external network.

14. A semiconductor fabrication facility comprising:

fabrication apparatuses, including an exposure apparatus, for various processes;

a local area network for linking said fabrication apparatuses; and a gateway that allows access from said local area network to an external network outside said semiconductor fabrication facility, wherein said exposure apparatus has exposure means for exposing and projecting a part of a pattern on an original plate onto a substrate through a projection optical system, a main stage that is movable in a direction so as to move at least one of the original plate and the substrate for exposure, a substage that is movable independently of said man stage, a multiphase actuator for generating a driving force when said main stage is accelerated and decelerated in the direction, and a single-phase actuator provided on at least one of said main stage and said substage for generating a driving force in the direction when said main stage moves at a constant speed, and wherein information about at least one of said fabrication apparatuses is exchanged by data communication.

15. A maintenance method for an exposure apparatus installed in a semiconductor fabrication facility, said method comprising the steps of:

providing a maintenance database connected to an external network outside said semiconductor fabrication facility by a vendor or a user of the exposure apparatus;

permitting access from said semiconductor fabrication facility to the maintenance database across the external network; and sending maintenance information stored in the maintenance database to the semiconductor fabrication facility across said external network, wherein the exposure apparatus has exposure means for exposing and projecting a part of a pattern on an original plate onto a substrate through a projection optical system, a main stage that is movable in a direction so as to move at least one of the original plate and the substrate for exposure, a substage that is movable independently of said main stage, a multiphase actuator for generating a driving force when the stage is accelerated and decelerated in the direction, and a single-phase actuator for generating a driving force provided on at least one of said main stage and said substage in the direction when the main stage moves at a constant speed.

16. A stage apparatus comprising:

a plurality of stages that are independently movable in a direction;

an electromagnetic actuator that serves to move said plurality of stages, wherein said electromagnetic actuator includes a plurality of moving parts that are tightly fastened to said stages and are provided corresponding to one stator; and means for performing power supply and data communication between at least two of said plurality of stages.

17. A stage apparatus comprising:

a plurality of stages that are independently movable in a direction;

an electromagnetic actuator that serves to move said plurality of stages, wherein said electromagnetic actuator includes a plurality of moving parts that are tightly fastened to said stages and are provided corresponding to one stator; and a second actuator provided between at least two of said plurality of stages to as to transmit a force to said plurality of stages.

* * * * *

UNITED STATES PATENT AND TRADEMARK OFFICE
CERTIFICATE OF CORRECTION

PATENT NO. : 6,891,599 B2
DATED : May 10, 2005
INVENTOR(S) : Kazunori Iwamoto

It is certified that error appears in the above-identified patent and that said Letters Patent is hereby corrected as shown below:

Title page,
Item [57], ABSTRACT,
Line 1, "comprising includes" should read -- includes --.

Column 5,
Line 59, "is" should read -- be --.

Column 7,
Line 43, "CCDS," should read -- CCDs, --.

Column 9,
Line 31, "that" should read -- who --.

Column 11,
Line 11, "said" should read -- the --.

Column 12,
Lines 18, 19, 57 and 59, "said" should read -- the --.
Line 31, "for" should read -- for performing --.
Line 44, "man" should read -- main --.

Signed and Sealed this

Fourth Day of October, 2005

JON W. DUDAS
*Director of the United States Patent and Trademark Office*